United States Patent
Lyons

(10) Patent No.: US 6,282,412 B1
(45) Date of Patent: *Aug. 28, 2001

(54) GEOGRAPHICALLY ADAPTIVE PORTABLE BROADCAST RECEIVER

(75) Inventor: Francis R. X. Lyons, Trenton, NJ (US)

(73) Assignee: Lucent Technologies Inc., Murray Hill, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/120,634

(22) Filed: Jul. 22, 1998

(51) Int. Cl.[7] ....................................................... H04B 1/18
(52) U.S. Cl. .................................. 455/186.1; 455/161.2; 455/166.1; 455/185.1; 455/558
(58) Field of Search ............................. 455/150.1, 160.1, 455/161.1, 161.2, 161.3, 166.1, 166.2, 179.1, 181.1, 185.1, 186.1, 186.2, 45, 558, 345, 418–420, 456, 556–559; 709/217–219

(56) References Cited

U.S. PATENT DOCUMENTS

| | | | |
|---|---|---|---|
| 5,214,792 | | 5/1993 | Alwadish . |
| 5,393,713 | * | 2/1995 | Schwob ............................... 455/186.1 |
| 5,438,687 | * | 8/1995 | Suchowerskyj et al. ........... 455/186.2 |
| 5,448,765 | * | 9/1995 | Kovanen et al. .................. 455/186.1 |
| 5,732,338 | * | 3/1998 | Schwob ............................... 455/186.1 |
| 5,819,166 | * | 10/1998 | Kimura et al. ..................... 455/186.1 |
| 5,864,753 | * | 1/1999 | Morita et al. ....................... 455/186.1 |
| 6,006,076 | * | 12/1999 | Nakamura .......................... 455/186.1 |
| 6,088,730 | * | 7/2000 | Kato et al. .......................... 455/556 |

OTHER PUBLICATIONS

Motorola, Specifications for GT Plus Oncore GPS Receiver (2 pages), Sep. 1997.

* cited by examiner

Primary Examiner—Lester G. Kincaid
(74) Attorney, Agent, or Firm—Law Office of Leo Zucker

(57) ABSTRACT

A broadcast receiver that responds to broadcast stations having a listener-preferred program style. The receiver has a processor and a database memory arranged to be coupled with the processor. The memory is configured to store information concerning a number of broadcast stations that serve at least a portion of a user-designated geographic area, and which stations have a designated program style. The information corresponds to an operating frequency for each broadcast station and an associated service coverage. A geographic position determining unit (e.g., a GPS receiver) is coupled to the processor and produces information corresponding to a current position of the receiver within the designated area. The processor is configured to produce a tuning signal operative to set a tuner unit to respond to a broadcast station that can be received at the receiver's position with the designated program style.

6 Claims, 3 Drawing Sheets

GEOGRAPHICALLY ADAPTIVE PORTABLE BROADCAST RECEIVER

BACKGROUND OF THE INVENTION

1. Field of the Invention

The present invention relates generally to broadcast receivers. In particular, the invention concerns a receiver arranged to respond selectively to broadcast stations with a desired program content regardless of the receiver's geographic location or position.

2. Discussion of the Known Art

Contemporary broadcast stations are driven by demographic analyses, and thus focus on particular kinds of program content to capture the stations' target audiences. That is, radio listeners tend to listen for a particular kind or "type" of broadcast station that best serves their personal listening preferences. Various types of radio program content are readily identifiable upon listening to most stations. For example; jazz, rock, R & B, news, country, talk, and the like.

A typical commercial AM or FM radio broadcast signal has an effective coverage radius of from about 30 to 60 miles. Most persons routinely travel distances that exceed the range of any one broadcast station; for example, when commuting, traveling on vacation, or as part of their jobs. Thus, as persons move from one broadcast area (market) to another, they must search manually for a station that is in range and has their preferred program style. When on vacation or taking other long excursions, persons usually have no knowledge of the broadcast programming available along a given route, and, thus, cannot readily find a station suited to their needs.

A Radio Data System (RDS) service was adopted in the United States in 1993. RDS applies only to VHF-FM broadcast stations, however. The service allows an FM station to encode a signal corresponding to a program type (PTY code) on a sub-carrier of the station's broadcast signal. Specially equipped FM-RDS receivers can operate to respond only to stations transmitting a desired program type code in response to button entries by a listener. Relatively few FM-RDS receivers have been put to use since adoption of the service in the United States. As a result, FM broadcast stations that encode RDS data on their signals also remain few in number.

Software known as "ID Logic" has been offered for use with broadcast receivers. As advertised, ID Logic equipped receivers use an "in-receiver database" of over 40,000 broadcast stations, with various different program types and other information stored for the stations.

SUMMARY OF THE INVENTION

According to the invention, a broadcast receiver for responding to broadcast stations having a listener-preferred program style, includes a processor arranged to control operations of the receiver, and a database memory arranged to be coupled to the processor. The memory is configured to store information concerning a determined number of broadcast stations each of which serves at least a portion of a user-designated geographic area, and which stations broadcast a designated program style. The stored information corresponds to an operating frequency for each broadcast station and an associated service coverage. A geographic position determining unit is coupled to the processor, and the unit is arranged to produce information corresponding to a current position of the receiver within the user-designated area. The processor is configured to produce a tuning signal operative to set a tuner unit to respond to a broadcast station that can be received at the position of the receiver with the designated program style, according to information stored in the database memory and current position information from the position determining unit.

For a better understanding of the invention, reference is made to the following description taken in conjunction with the accompanying drawing and the appended claims.

DETAILED DESCRIPTION OF THE INVENTION

Figure 1:
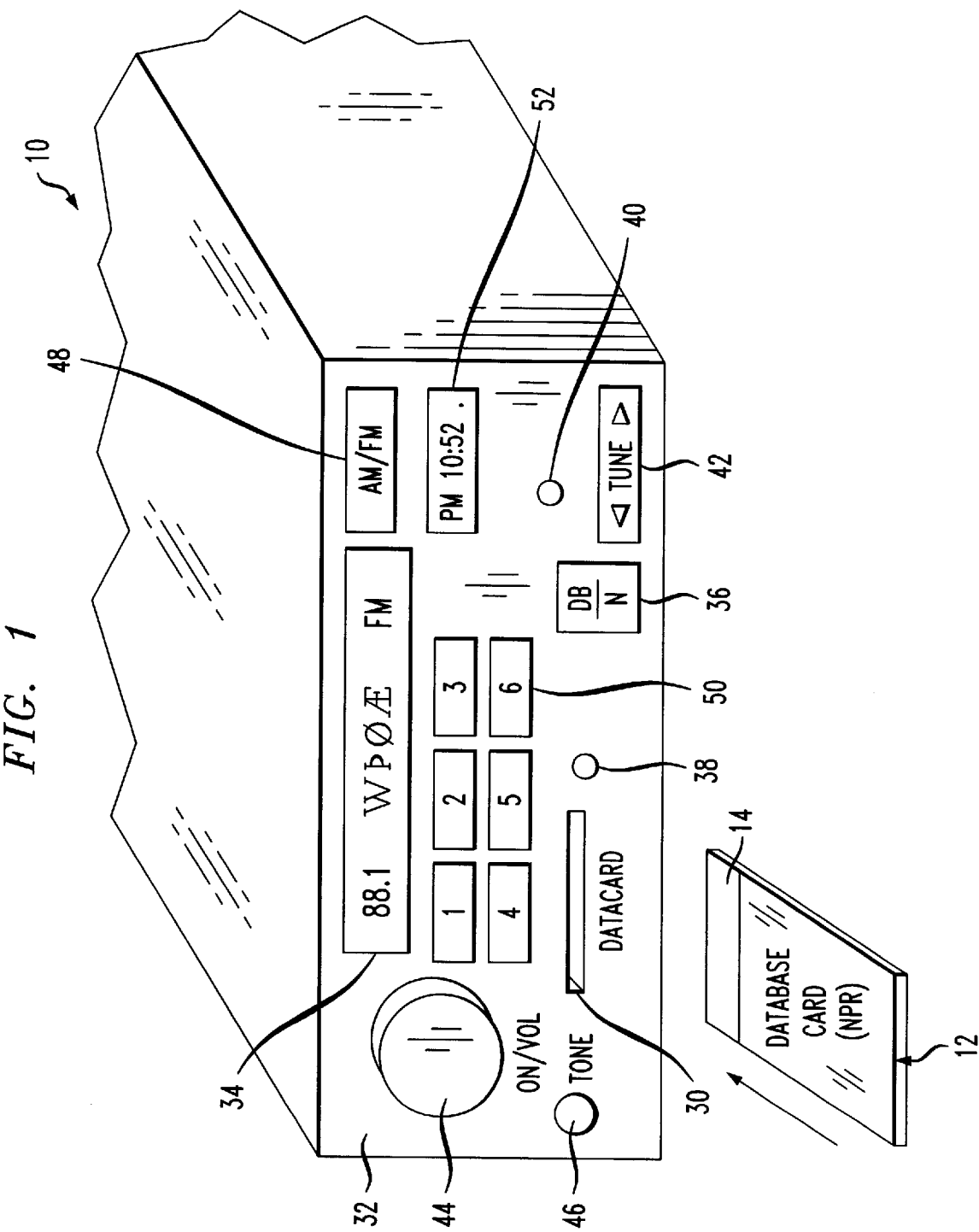
FIG. 1 is a view of a front portion of a broadcast receiver and a database memory card according to the invention.

FIG. 1 shows a front portion of a broadcast receiver 10 with a separate, insertable and removable database memory card 12, according to the invention. It will be understood from the following description that instead of using a detachably connectable memory card, the receiver 10 can operate with an internal database memory for storing information of the kind stored in the card 12, provided the information can be downloaded to the database memory by a connector or equivalent means (not shown) on the receiver 10.

The memory card 12 may be in the form of a commercially available programmable memory card having a connecting terminal section 14 at a leading edge of the card. Specifically, the card 12 may be a flash memory or an electronically erasable programmable read-only-memory ($E^2$PROM) having enough memory capacity to store information concerning a determined number of broadcast stations that serve at least a portion of a user-designated geographic area, and which have a program style that suits a designated user preference. Information corresponding to each station's operating or carrier frequency and an associated service coverage area, is stored by the card 12.

Figure 2:
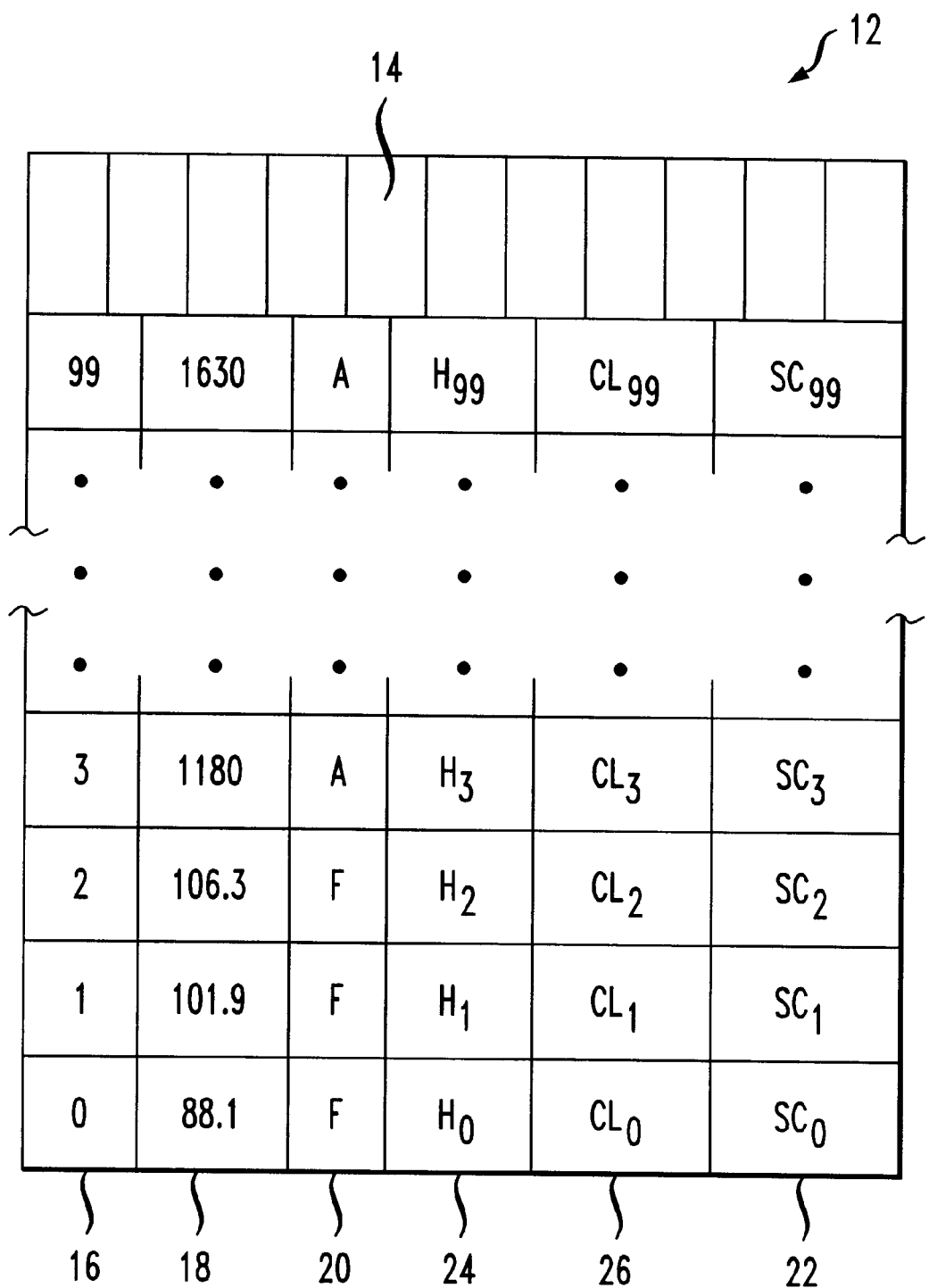
FIG. 2 is a memory map for the database memory card in FIG. 1.

FIG. 2 is an example of a memory map for the database memory card 12. The map may also apply to the mentioned alternate, internal database memory. In FIG. 2, information concerning a number of AM or FM broadcast stations, or both, is loaded at corresponding memory addresses 16. For example, the stations may be ones that can be received adequately at certain locations along an automobile route that a listener is planning to drive between two specified cities. Further, all of the stations broadcast a user's preferred program type, e.g., jazz music, during at least some hours on given days. Each memory address 16 has associated frequency data 18 corresponding to the station's operating or carrier frequency, modulation data 20 to identify whether the station is frequency modulated (F) or amplitude modulated (A), station service coverage data 22 defining the station's geographic scope of listener coverage in terms of, e.g., global latitude and longitude information; time data 24 corresponding to the hours (and, optionally, specific days) during which the station broadcasts the preferred program style, and call-letter data 26 identifying the station's call sign.

All of the data loaded in the database memory card 12 is obtained, for example, from a master database of broadcast stations that includes each station's geographic service coverage and its broadcast program style. It will be understood that such a master database can be made accessible to users by, e.g., an Internet web site or a direct dial-up telephone connection.

Using a commercially available memory card interface and a personal computer having a telephone modem (not shown), the user enters information designating a program style preference, and a geographic area such as a specified travel route between two cities. An application program resident in the user's own computer, or at a server of the master database, selects from the database only those stations whose service coverage at least partly overlaps the user's specified travel route. Data associated with the selected stations is then downloaded to the user, so that his/her memory card 12 is loaded or updated via the memory card interface. The user's card 12 is then ready to be inserted in a "datacard" slot 30 in a front panel 32 of the receiver 10 in FIG. 1. Details of the mentioned application program and memory card interface can be determined by persons skilled in the art in view of the present disclosure.

As shown in FIG. 1, the receiver 10 also has a display 34 to show the carrier frequency of a broadcast station to which the receiver 10 is tuned. If the receiver 10 is in a database operating mode, the display 34 can show any of the data stored in the memory card 12, for example, the station's call sign and modulation, in addition to its carrier frequency. To allow the receiver 10 to be switched between the database operating mode and a normal one, a mode switch 36 is accessible on the front panel 32. When switched to the database mode, an indicator lamp 38 next to the datacard slot 30 is illuminated. When in the normal mode, lamp 38 is extinguished and another lamp 40 is illuminated over a tuning control bar 42.

Other controls provided on the receiver panel 32 are those found on conventional receivers, e.g., an ON/OFF volume control 44, tone adjust 46, AM/FM band select button 48, station pre-set buttons 50, and a time clock 52. The receiver 10 may be in the form of an automobile radio for mounting in a dashboard, or a portable or desktop radio that the user may physically transport from one location to another.

Figure 3:
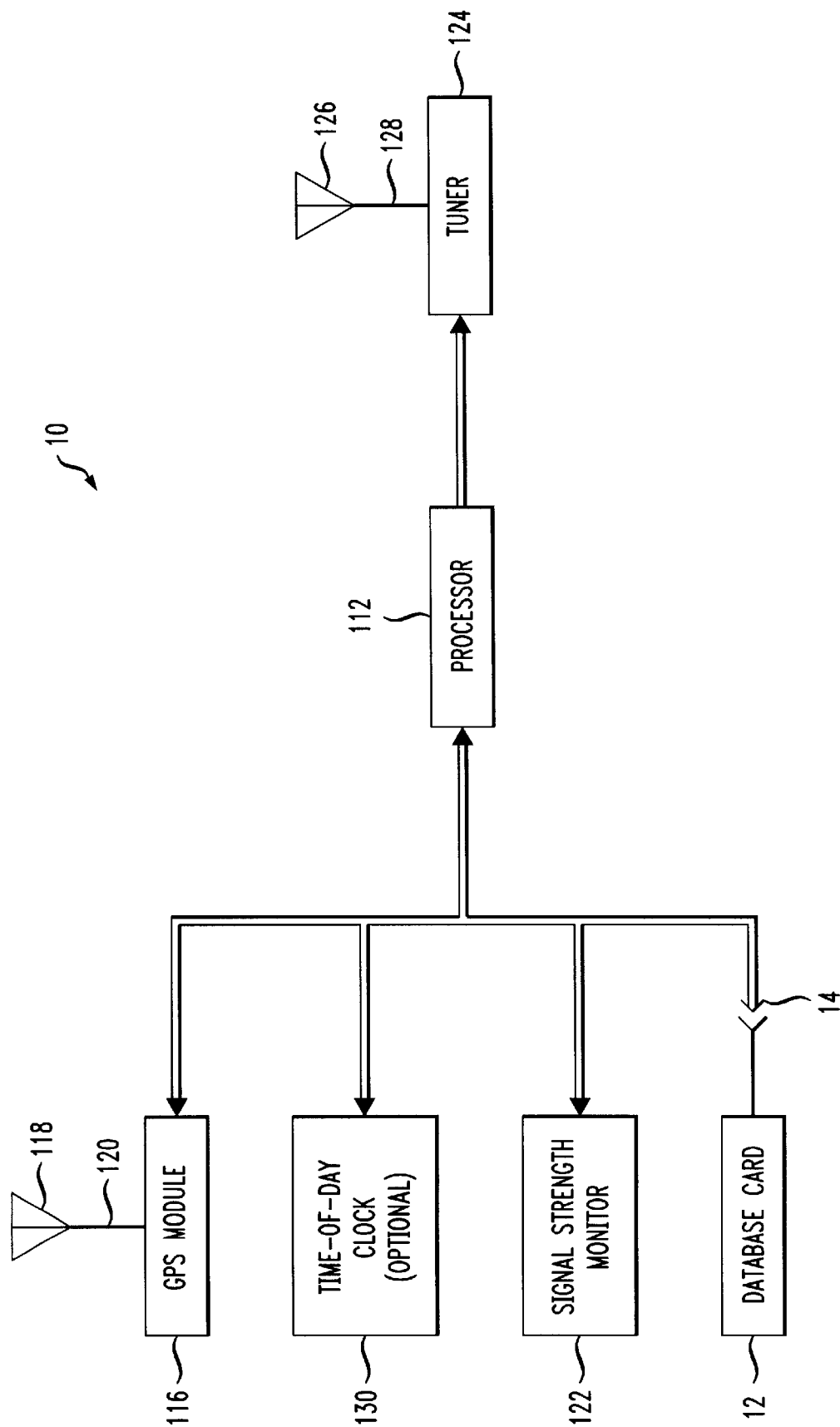
FIG. 3 is a schematic block diagram of a broadcast receiver according to the invention.

FIG. 3 is a block diagram of the broadcast receiver 10 according to the invention. The receiver 10 includes a processor 112 that controls other operating components of the receiver, and the timing and sequence of operations carried out by these components. For example, the processor 112 may be a commercially available integrated circuit (IC) chip, or it may be an application specific one (ASIC). Processor 112 has an associated read only memory (ROM) that stores one or more operating programs enabling the processor to carry out its functions, and one or more random access memories (RAMs) for storing ongoing operating data. Processor 112 also has associated input and output (IO) stages enabling data to be exchanged between the processor and those components under its control, as is known in the art.

The database memory card 12 is coupled to the processor 112 via a pin connector 114 when the card is inserted in the slot 30 in the receiver 10. As mentioned, an alternate, internal database memory may instead be "hard-wired" with the processor 112. Such an internal memory would have an associated cable connector or equivalent means such as an infra-red (IR) receiver, to allow data to be entered into the memory from an outside data terminal or modem using a known data transmission protocol.

A conventional position determining unit 116 is also coupled with the receiver processor 112. The unit 116 may comprise a commercially available global positioning system (GPS) receiver, such as, e.g., a GT Plus Oncore (TM) GPS receiver available from Motorola, Inc., Northbrook, Ill. An antenna module 118 associated with the unit 116 is located remote from the unit 116 for adequate reception through a coaxial cable 120. The unit operates to produce information corresponding to a current position of the receiver 10 within the geographic area designated by the user. Such information typically comprises data corresponding to a global latitude and longitude.

A receive signal strength (RSS) monitor stage 122 is configured to measure a relative signal strength of each station to which the receiver 10 is tuned. Data corresponding to signal strength is reported from the stage 122 to the processor 112 at set intervals. The RSS stage 122 is also of conventional configuration.

A receiver tuner unit 124 is constructed and arranged to be set to respond to a broadcast station signal at a carrier frequency that corresponds to a tuner signal output from the processor 112. In the present embodiment, unit 124 comprises an AM and an FM tuner. The tuning signal from processor 112 thus serves to select either the AM or the FM tuner, and to set the selected tuner to respond to a carrier signal whose frequency is obtained from selected frequency data stored by the card 12. For example, the tuning signal sets a voltage that is applied to a varactor tuning diode in the unit 124. A suitable AM/FM antenna 126 is connected to the unit 124 by a coaxial cable 128. The manner by which the receiver 10 selects the stored frequency data for setting the tuning unit 124, is explained below.

Receiver 10 may also have a time of day and date clock 130 coupled with the processor 112. If the database memory card 12 has stored data indicating a time of day (and date) on which a certain station broadcasts the designated program type, such data is compared by the processor 112 with current time information supplied by the clock 130 to determine if the station is currently available for listening by the user.

When in the database operating mode, the receiver 10 operates as follows. The position determining unit 116 periodically sends data concerning the receiver's current position to the processor 112. Thus, if the radio is in a moving vehicle, position data output from unit 116 will vary accordingly. The processor 112 compares current position data from the unit 116, with all of the station service coverage data 22 stored at the memory addresses 16 in the card 12. Those addresses having service coverage data 22 that coincides with the receiver's present position, and having time data 24 that coincides with current time data from the clock 130 (if provided), are identified as representing potential broadcast frequencies to which the receiver can be tuned to receive the user's designated program style. Frequency data 18 at each of the identified addresses 16 is read from the card 12 and processed to produce a sequence of corresponding tuning signals from the processor 112.

While the tuner unit 116 is set to respond to station signals at each potential frequency in response to the mentioned sequence of tuning signals, a relative signal strength measurement is performed by the RSS unit 122. The processor 112 is programmed and configured to determine which of the RSS measurements is optimal (e.g., the strongest), and then outputs a steady tuning signal which sets the tuner unit to respond to the optimally measured broadcast signal over a given listening period. Typically, the processor 112 is also programmed so that at the end of a listening period, the processor re-evaluates the receiver's current position and scans all potential frequencies. Thus, the receiver 10 always responds to an optimal broadcast station serving the receiver's location with the designated program style, regardless of the receiver's position within the user-designated geographic area. In addition, such re-evaluations may be initiated when desired by the user if, for example, a "re-tune" button operative to send a re-evaluation command to the processor is provided on the receiver panel 32.

While the foregoing description represents a preferred embodiment of the invention, it will be obvious to those skilled in the art that various changes and modifications may be made, without departing from the spirit and scope of the invention pointed out by the following claims.

I claim:

1. A broadcast receiver for responding to broadcast stations having a listener-preferred program style, comprising:
    a processor arranged to control operations of the receiver;
    a database memory arranged to be coupled to the processor, wherein said memory is in the form of a memory card with a connecting terminal section and is configured to store information concerning a number of broadcast stations having a pre-defined program style and situated over a pre-defined geographic area, said information corresponding to an operating frequency for each broadcast station, the station's service coverage within the pre-defined geographic area, and times during which the station broadcasts the pre-defined program style;
    the memory card has an associated interface arranged for coupling with a database and configured so that a listener can download from the database into the memory card said information concerning only the broadcast stations having said pre-defined program style and situated over said pre-defined geographic area;
    an electrical card connector coupled to the processor, wherein the connecting terminal section of the memory card is arranged to engage said card connector;
    a geographic position determining unit coupled to said processor, said unit being constructed and arranged to produce information corresponding to a current position of the receiver within the designated geographic area; and
    a tuner unit coupled to the processor;
    wherein said processor is configured to produce a tuning signal operative to set the tuner unit to respond to a broadcast station having the pre-defined program style and which station can be received at the position of the receiver, in accordance with the information downloaded into the memory card by the listener, and the information from the position determining unit.

2. A broadcast receiver according to claim 1, wherein said geographic position determining unit comprises a global positioning system (GPS) receiver.

3. A broadcast receiver according to claim 1, wherein said memory card comprises a programmable read-only-memory.

4. A broadcast receiver according to claim 1, including a receive signal strength (RSS) monitor stage coupled to the processor and configured to measure a relative signal strength of a station to which the tuner unit is set to respond by said tuning signal.

5. A broadcast receiver according to claim 4, wherein said processor is configured to produce a sequence tuning signals corresponding to frequency data read from a number of identified addresses of the memory card.

6. A broadcast receiver according to claim 5, wherein said processor is programmed to determine which of a number of RSS measurements performed by the RSS monitor stage during said sequence of tuning signals is strongest.

* * * * *